United States Patent
Ohtsuka et al.

(10) Patent No.: US 8,093,598 B2
(45) Date of Patent: Jan. 10, 2012

(54) POWER SEMICONDUCTOR DEVICE

(75) Inventors: Kenichi Ohtsuka, Tokyo (JP); Naruhisa Miura, Tokyo (JP); Masayuki Imaizumi, Tokyo (JP); Tatsuo Oomori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/162,998

(22) PCT Filed: Mar. 19, 2007

(86) PCT No.: PCT/JP2007/055514
§ 371 (c)(1),
(2), (4) Date: Aug. 1, 2008

(87) PCT Pub. No.: WO2007/108439
PCT Pub. Date: Sep. 27, 2007

(65) Prior Publication Data
US 2009/0020766 A1 Jan. 22, 2009

(30) Foreign Application Priority Data
Mar. 22, 2006 (JP) .................. 2006-078348

(51) Int. Cl.
*H01L 31/0312* (2006.01)
(52) U.S. Cl. ............ 257/77; 257/E29.104; 257/E23.142
(58) Field of Classification Search .................. 257/77, 257/341, 500, 578, E29.104, 774, E23.001, 257/E23.142
See application file for complete search history.

(56) References Cited

U.S. PATENT DOCUMENTS

| 5,385,855 | A | 1/1995 | Brown et al. |
| 5,814,859 | A * | 9/1998 | Ghezzo et al. ............... 257/335 |
| 5,929,523 | A | 7/1999 | Parsons |
| 6,150,246 | A | 11/2000 | Parsons |
| 7,135,774 | B2 | 11/2006 | Tanimoto |

(Continued)

FOREIGN PATENT DOCUMENTS

EP 1 460 681 A2 9/2004

(Continued)

OTHER PUBLICATIONS

Office Action issued Aug. 30, 2010, in Korean Patent Application No. 2008-7022914, filed Sep. 19, 2008 (with partial English-language Translation).

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

A power semiconductor device less prone to cause a reaction between a metal material for interconnection and an electrode or the like connected to a semiconductor region during the high-temperature operation thereof and less prone to be strained during the high-temperature operation thereof. The power semiconductor device can be an SiC power device or the like in which a first metal layer containing at least one selected from the group consisting of Pt, Ti, Mo, W and Ta is formed on a source electrode formed on the semiconductor region, such as a source region or the like. A second metal layer containing at least one selected from the group consisting of Mo, W and Cu is formed on the first metal layer. A third metal layer containing at least one selected from the group consisting of Pt, Mo and W is formed on the second metal layer.

7 Claims, 10 Drawing Sheets

U.S. PATENT DOCUMENTS

| | | |
|---|---|---|
| 7,217,954 B2 | 5/2007 | Kusumoto et al. |
| 7,329,614 B2 | 2/2008 | Tanimoto |
| 2002/0092763 A1 | 7/2002 | Denning et al. |
| 2006/0035458 A1* | 2/2006 | Nelle et al. .................... 438/624 |
| 2007/0007653 A1* | 1/2007 | Chen et al. .................... 257/751 |

FOREIGN PATENT DOCUMENTS

| | | |
|---|---|---|
| EP | 1 577 931 A2 | 9/2005 |
| JP | 9 22922 | 1/1997 |
| JP | 10-12571 | 1/1998 |
| JP | 2000 323436 | 11/2000 |
| JP | 2002 158354 | 5/2002 |
| JP | 2003-152182 | 5/2003 |
| JP | 2003-318395 | 11/2003 |
| JP | 2005 310902 | 11/2005 |
| JP | 2005-311284 | 11/2005 |
| JP | 2006-24880 | 1/2006 |
| JP | 2006 32456 | 2/2006 |
| WO | WO 97/33308 | 9/1997 |

* cited by examiner ional high-breakdown-voltage low-loss power switching devices. Examples of the power devices include an MISFET (a field effect transistor having a metal-insulator-semiconductor structure; in which an example of the insulator is an oxide such as a silicon oxide, and an example of the MIS is an MOS), a Schottky diode, and the like.

POWER SEMICONDUCTOR DEVICE

TECHNICAL FIELD

The present invention relates to a power semiconductor device which is a power device.

BACKGROUND ART

In recent years, improvements in characteristics of power devices have been required from the viewpoint of energy saving. To meet the requirements, power devices using SiC (silicon carbide) in addition to conventional power devices using Si (silicon) have been regarded as promising next-generation high-breakdown-voltage low-loss power switching devices. Examples of the power devices include an MISFET (a field effect transistor having a metal-insulator-semiconductor structure; in which an example of the insulator is an oxide such as a silicon oxide, and an example of the MIS is an MOS), a Schottky diode, and the like.

As an example, a MOSFET using SiC employs a device structure pursuant to the conventional device structure of a MOSFET using Si. Because SiC is greater in bandgap than Si, the SiC-MOSFET is capable of operating at higher temperatures than the conventional Si-MOSFET which has been operated at a temperature less than 200° C.

Patent Documents 1 to 5 disclose techniques related to semiconductor devices using SiC.

Patent Document 1: Japanese Patent Application Laid-Open No. 2005-310902

Patent Document 2: Japanese Patent Application Laid-Open No. 9-22922 (1997)

Patent Document 3: Japanese Patent Application Laid-Open No. 2006-32456

Patent Document 4: Japanese Patent Application Laid-Open No. 2000-101099

Patent Document 5: Japanese Patent Application Laid-Open No. 2005-268430

Conventionally, Al (aluminum) or an Al-based material having Al as a chief component and including alloys of Al with Si, Cu (copper), Ti (titanium), Pd (palladium) and the like has been used as a metal material for interconnection in power devices. However, when the Al-based material is employed as the metal material for interconnection, operation at a high temperature exceeding 200° C. is prone to cause the metal material to react with an electrode connected to a semiconductor region in a semiconductor substrate or a silicon film and the like formed on the surface of the semiconductor substrate, and to cause oxidation of the surface of the metal material, thereby degrading the reliability of the device.

In view of the above-mentioned problem with the Al-based material, Patent Document 1 described above proposes the use of a Cu-based material as an interconnect metal in a SiC power device. However, the thermal expansion coefficient of Cu is $17 \times 10^{-6}$ K$^{-1}$, and this value is significantly different from those of semiconductor materials such as Si (having a thermal expansion coefficient of $4.2 \times 10^{-6}$ K$^{-1}$) and SiC (having a thermal expansion coefficient of $3.7 \times 10^{-6}$ K$^{-1}$). For this reason, the use of the Cu-based material as the metal material for interconnection in power devices employing Si and SiC causes a strain in the power devices during high-temperature operation to present the problem of the reliability of the devices.

DISCLOSURE OF THE INVENTION

In view of the foregoing, it is an object of the present invention to provide a power semiconductor device which is a power device less prone to cause a reaction between a metal material for interconnection and an electrode connected to a semiconductor region during the high-temperature operation thereof and less prone to be strained during the high-temperature operation thereof.

The present invention is intended for a power semiconductor device which comprises: a semiconductor layer having a surface; a semiconductor region of a predetermined conductivity type, said semiconductor region being formed in said semiconductor layer so as to be exposed at least at a portion of said surface of said semiconductor layer; a first insulation film formed on said semiconductor region; an electrode formed on said semiconductor region or on said first insulation film; a first metal layer formed on said electrode and containing at least one selected from the group consisting of Pt, Ti, Mo, W and Ta; and a second metal layer formed on said first metal layer and containing at least one selected from the group consisting of Mo, W and Cu.

The present invention includes the first metal layer containing at least one selected from the group consisting of Pt, Ti, Mo, W and Ta, and the second metal layer containing at least one selected from the group consisting of Mo, W and Cu. The use of any one of Mo, W and Cu which are materials having low reactivity for the second metal layer makes a reaction between the electrode formed on the semiconductor region or on the first insulation film and the second metal layer less prone to occur even during high-temperature operation when the second metal layer is used as an interconnect metal. The provision of the first metal layer containing at least one selected from the group consisting of Pt, Ti, Mo, W and Ta which are materials having lower reactivity between the electrode and the second metal layer prevents the phenomenon of the incorporation of other metal species into the electrode even during high-temperature operation. When a metal layer containing Cu is used as the second metal layer, the provision of the first metal layer between the semiconductor region and the second metal layer reduces a strain resulting from the difference in thermal expansion coefficient between the semiconductor region and the second metal layer. This achieves the power semiconductor device less prone to cause a reaction between the metal material for interconnection and the electrode connected to the semiconductor region during high-temperature operation thereof and less prone to be strained during high-temperature operation thereof.

These and other objects, features, aspects and advantages of the present invention will become more apparent from the following detailed description of the present invention when taken in conjunction with the accompanying drawings.

BEST MODE FOR CARRYING OUT THE INVENTION

First Preferred Embodiment

This preferred embodiment provides a power semiconductor device which is an SiC power device including: an electrode formed on a semiconductor region or on an insulation film overlying a semiconductor region; a first metal layer formed on the electrode and containing at least one selected from the group consisting of Pt, Ti, Mo, W and Ta; a second metal layer formed on the first metal layer and containing at least one selected from the group consisting of Mo, W and Cu; and a third metal layer formed on the second metal layer and containing at least one selected from the group consisting of Pt, Mo and W.

Figure 1:
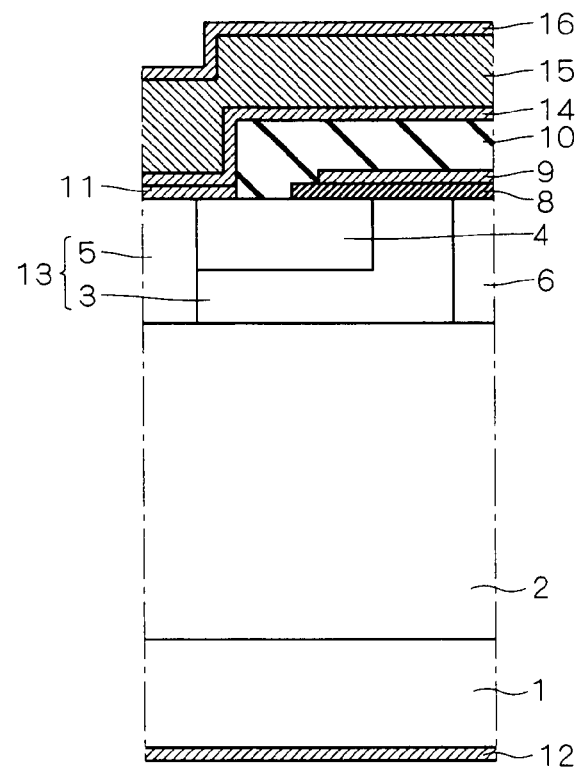
FIG. 1 is a view showing part of a power semiconductor device according to a first preferred embodiment.

FIG. 1 is a view showing part of the power semiconductor device according to the first preferred embodiment. FIG. 1 shows a section of the smallest unit (referred to hereinafter as a device unit structure) of the device structure of the SiC power device (as an example, an n-channel SiC MOSFET). The power semiconductor device according to the first preferred embodiment is structured to have a plurality of such device unit structures arranged in succession leftwardly and rightwardly as seen in FIG. 1 so that adjacent ones of the device unit structures are mirror images of each other.

As shown in FIG. 1, an n-type SiC drift layer 2 serving as a semiconductor layer for holding a breakdown voltage is formed by epitaxial growth on a surface of an n-type low-resistance SiC substrate 1 serving as a semiconductor substrate. The n-type SiC drift layer 2 has a thickness of the order of 3 to 20 μm, and has a doping concentration of the order of $1 \times 10^{15}$ to $15 \times 10^{15}/cm^3$.

A p-type SiC region 13 and an n-type SiC depletion region 6 are formed on a surface of the n-type SiC drift layer 2. The p-type SiC region 13 includes a p-type SiC base region 3 and a p-type SiC contact region 5. The n-type SiC depletion region 6 is adjacent to the p-type SiC base region 3. The p-type SiC contact region 5 is a portion of the p-type SiC region 13 which is in contact with a source electrode to be described later. An n-type SiC source region 4 serving as a semiconductor region which is separated from the n-type SiC depletion region 6 and is adjacent to the p-type SiC contact region 5 is formed on a surface of the p-type SiC base region 3.

The p-type SiC region 13 and the n-type SiC source region 4 are selectively formed by performing ion implantation into the n-type SiC drift layer 2 and activation heat treatment thereof. In other words, the p-type SiC region 13 and the n-type SiC source region 4 serving as semiconductor regions are formed in the n-type SiC drift layer 2 so as to be exposed at a portion of the surface of the n-type SiC drift layer 2 serving as the semiconductor layer.

The p-type SiC region 13 has a thickness of the order of 0.5 to 2 μm, and has a doping concentration of the order of $3 \times 10^{17}$ to $20 \times 10^{17}/cm^3$. The n-type SiC source region 4 has a thickness of the order of 0.3 to 1 μm, and has a doping concentration of the order of $5 \times 10^{18}$ to $50 \times 10^{18}/cm^3$. The p-type contact region 5 serving as a portion of the p-type SiC region 13 which is in contact with the source electrode is formed by additionally performing selective ion implantation so as to have a doping concentration of the order of $5 \times 10^{18}$ to $50 \times 10^{18}/cm^3$ which is higher than that of the other portion (the p-type SiC base region 3).

An n-type region in the n-type SiC drift layer 2 where the p-type SiC region 13 is not formed is the n-type SiC depletion region 6. The doping concentration of the n-type SiC depletion region 6 may remain equal to that of the n-type SiC drift layer 2. Alternatively, the doping concentration of the n-type SiC depletion region 6 may be increased to of the order of $3 \times 10^{16}$ to $30 \times 10^{16}/cm^3$ by additionally performing ion implantation or by changing a doping profile as the n-type SiC drift layer 2 grows. Increasing the doping concentration in this manner achieves the reduction in device resistance.

A source electrode 11 electrically connected to the n-type SiC source region 4 is formed on the n-type SiC source region 4 and the p-type SiC contact region 5. A drain electrode 12 is formed on a lower surface of the n-type low-resistance SiC substrate 1. A multi-layer structure having a gate insulation film 8 which is a silicon oxide film, a silicon oxy-nitride film or the like and a gate electrode 9 which is a polysilicon film, a metal film or the like is formed on a portion of the p-type SiC base region 3 which lies between the n-type SiC source region 4 and the n-type SiC depletion region 6, on the n-type SiC depletion region 6 and on a portion of the n-type SiC source region 4. The gate insulation film 8 has a thickness, for example, of the order of 10 to 100 nm.

An interlayer insulation film 10 which is a silicon oxide film or the like is formed on the multi-layer structure having the gate insulation film 8 and the gate electrode 9 and on the n-type SiC source region 4. The interlayer insulation film 10 is formed over the entire surface of the n-type SiC drift layer 2 after the multi-layer structure having the gate insulation film 8 and the gate electrode 9 is formed. Thereafter, a portion of the interlayer insulation film 10 in which the source electrode 11 is to be formed is removed. In the removed portion, the source electrode 11 is formed. In other words, the interlayer insulation film 10 is present in a region which is on the surface of the n-type SiC drift layer 2 and which is other than the region where the source electrode 11 is formed. The source electrode 11 and the drain electrode 12 are metal layers made of Ni or containing Ni. As shown in FIG. 1, first to third metal layers 14 to 16 extend over the interlayer insulation film 10.

The first metal layer 14 is formed on the source electrode 11. The second metal layer 15 is formed on the first metal layer 14. The third metal layer 16 is formed on the second metal layer 15. The first to third metal layers 14 to 16 are combined with each other to function as an interconnect metal layer.

The second metal layer 15 is a portion responsible for a principal function as an interconnect line. The second metal layer 15 is formed by a metal film containing at least one selected from the group consisting of Cu (copper), Mo (molybdenum) and W (tungsten) which are low in reactivity and high in electrical conductivity. The second metal layer 15 may be a single-layer film made of one of these metals or a multi-layer film or an alloy film containing at least one selected from the group consisting of these three metals. The second metal layer 15 has a thickness, for example, of the order of 100 to 700 nm.

The first metal layer 14 has the function of preventing the second metal layer 15 serving as the interconnect line from reacting with the interlayer insulation film 10 (made of silicon oxide) and the source electrode 11 (made of Ni-based metal) during high-temperature operation, which in turn gives rise to the degradation of device characteristics. The first metal layer 14 also has the function of preventing the second metal layer 15 from reacting with polysilicon which is the material of the gate electrode 9.

The first metal layer 14 contains at least one of the following five metals: three metals, i.e. Ti (titanium), Pt (platinum) and Ta (tantalum), which are low in reactivity; and two metals, i.e. Mo (molybdenum, which has a thermal expansion coefficient of $5.1 \times 10^{-6}$ K$^{-1}$) and W (tungsten, which has a thermal expansion coefficient of $4.5 \times 10^{-6}$ K$^{-1}$), which are close in thermal expansion coefficient to a semiconductor material such as Si and SiC. Specifically, a single-layer film made of each of the above-mentioned five metals, an alloy film containing any one of the five metals, or a multi-layer film including a single-layer film made of any one of the five metals may be used as the first metal layer 14.

Examples of the alloy film may include nitrides such as TiN, WN, WSiN and TaN in addition to an alloy film of metals such as TiW and WSi. Examples of the multi-layer film may include such a structure as Pt/Ti/Pt/Ti . . . Pt/Ti which is obtained by stacking a multi-layer structure having Pt and Ti over many cycles. Additionally, a multi-layer structure including the above-mentioned alloy film or nitride and the metal film, such as Ti/TiN and TaN/Ta structures, may be used.

The first metal layer 14 has a thickness, for example, of the order of 5 to 100 nm when the first metal layer 14 is a single-layer film, and has a thickness of the order of 10 to 200 nm when the first metal layer 14 has a multi-layer structure. The first metal layer 14 may be relatively large in thickness when the chief component of the first metal layer 14 is Mo or W which are close in thermal expansion coefficient to a semiconductor material such as Si and SiC.

A multi-layer structure combination of the second metal layer 15 and the first metal layer 14 may be various structures such as, for example, Cu/Ti/TiN, Cu/WSiN, Cu/WSi, Cu/TaN/Ta, Cu/Pt/Ti, W/WN, W/Pt/Ti, W/TiN, Mo/TiN, Mo/Pt/Ti and the like.

When the chief component of the second metal layer 15 responsible for the principal function as the interconnect line is Cu, it is desirable that the first metal layer 14 used herein is an alloy film containing W or a multi-layer film in which a thin film having a thickness of the order of 5 to 20 nm and containing Ti having lower reactivity is used as a bottom-layer film in contact with the source electrode 11 in consideration for the difference in thermal expansion coefficient between SiC and the second metal layer 15. On the other hand, when the chief component of the second metal layer 15 responsible for the principal function as the interconnect line is Mo or W, the first metal layer 14 may be formed by appropriately combining a single-layer film and an alloy film which contain Ti, Pt and Ta having low reactivity because there is a small difference in thermal expansion coefficient between SiC and the second metal layer 15. Examples of the alloy film containing W include TiW, WSi, WN and WSiN. Examples of the multi-layer film in which the thin film having the thickness of the order of 5 to 20 nm and containing Ti having lower reactivity is used as the bottom-layer film in contact with the source electrode 11 include TiN/Ti (in which Ti has a thickness of 5 to 20 nm), Ti/TiN (in which TiN has a thickness of 5 to 20 nm), and Pt/Ti (in which Ti has a thickness of 5 to 20 nm). Pt/Ti may have a multi-layer structure obtained by stacking Pt/Ti each having a thickness of 5 to 20 nm over many cycles to thereby prevent a reaction during high-temperature operation. Examples of the combination of the single-layer film and the alloy film which contain Ti, Pt and Ta having low reactivity include TiN/Ti, Ti/TiN, Pt/Ti, TaN/Ta and Ta/TaN.

The interlayer insulation film 10 has a width of 3 to 10 µm as seen in FIG. 1, and a thickness of the order of 1 to 3 µm. Since the interlayer insulation film 10 is greater in width and thickness than the source electrode 11, it is necessary to take into consideration the reaction between the interlayer insulation film 10 and the first metal layer 14 and stresses thereof. From this point of view, it is desirable that the first metal layer 14 used herein is an alloy film containing W or a multi-layer film in which a thin film having a thickness of the order of 5 to 20 nm and containing Ti having lower reactivity is used as a bottom-layer film in contact with the source electrode 11, when the chief component of the second metal layer 15 responsible for the principal function as the interconnect line is Cu. When the chief component of the second metal layer 15 responsible for the principal function as the interconnect line is Mo or W and the first metal layer 14 is formed by appropriately combining a single-layer film and an alloy film which contain Ti, Pt and Ta having low reactivity, it is desirable that the first metal layer 14 used herein is a multi-layer film in which a thin film having a thickness of the order of 5 to 20 nm is used as a bottom-layer film in contact with the interlayer insulation film 10.

The third metal layer 16 has the function of preventing the surface of the second metal layer 15 from oxidizing during high-temperature operation when the second metal layer 15 serving as the interconnect line contains Cu. The third metal layer 16 is a metal film containing at least one selected from the group consisting of Pt, Mo and W. The use of such a film prevents the oxidation of the surface of the second metal layer 15. Examples of the third metal layer 16 may include an alloy film of TiW and WN and a multi-layer film such as Pt/Ti in addition to a single layer film of Mo, W and Pt.

The n-type SiC drift layer 2, the p-type SiC base region 3, the n-type SiC depletion region 6, the n-type SiC source region 4, the p-type SiC contact region 5, the source electrode 11, the multi-layer structure having the gate insulation film 8 and the gate electrode 9, the interlayer insulation film 10, the first to third metal layers 14 to 16, and a metal interconnect layer formed on the gate electrode 9 constitute a single device unit structure.

A method of manufacturing the power semiconductor device of FIG. 1 will be described below. FIGS. 2 to 13 are views showing steps in the process of manufacturing the power semiconductor device according to the first preferred embodiment.

Figure 2:
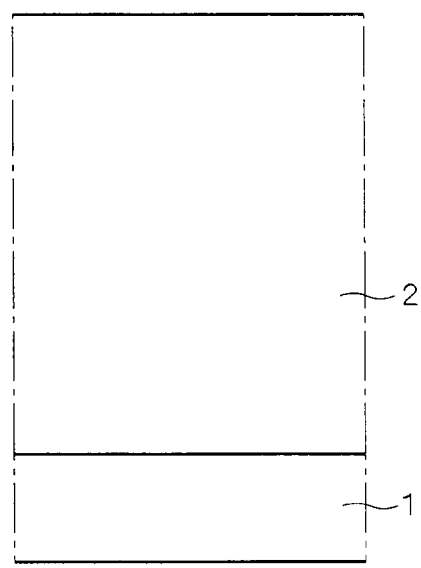
FIG. 2 is a view showing a step in the process of manufacturing the power semiconductor device according to the first preferred embodiment.
Figure 3:
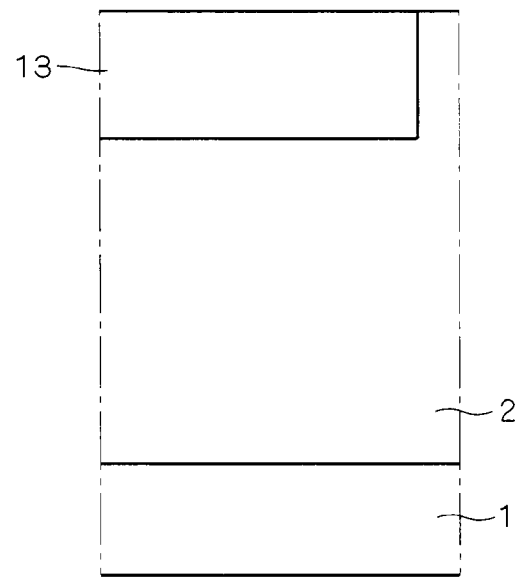
FIG. 3 is a view showing a step in the process of manufacturing the power semiconductor device according to the first preferred embodiment.

First, as shown in FIG. 2, the n-type SiC drift layer 2 is formed on the n-type low-resistance SiC substrate 1 by an epitaxial growth technique. Next, as shown in FIG. 3, impurity ion implantation into the surface of the n-type SiC drift layer 2 and activation heat treatment thereof are performed to selectively form the p-type SiC region 13. The p-type SiC region 13 may be controlled to have a thickness of the order of 0.5 to 2 µm, and to have a doping concentration of the order of $3 \times 10^{17}$ to $2 \times 10^{18}/cm^3$.

Figure 4:
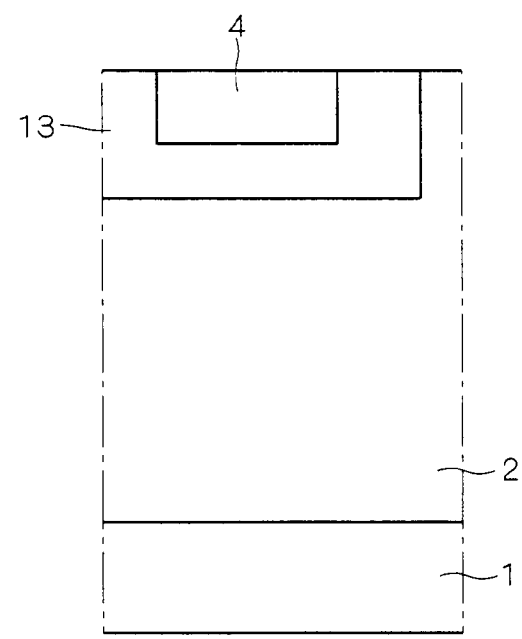
FIG. 4 is a view showing a step in the process of manufacturing the power semiconductor device according to the first preferred embodiment.
Figure 5:
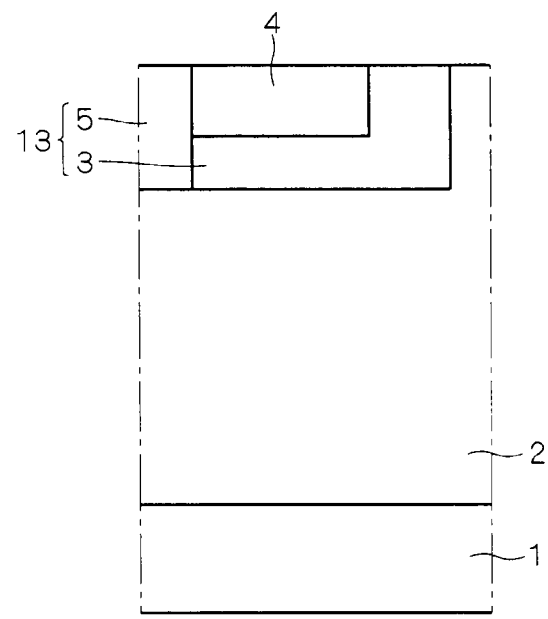
FIG. 5 is a view showing a step in the process of manufacturing the power semiconductor device according to the first preferred embodiment.

Next, as shown in FIG. 4, impurity ion implantation into the surface of p-type SiC region 13 and activation heat treatment thereof are performed to form the n-type SiC source region 4. Subsequently, selective ion implantation is performed to form the p-type SiC contact region 5, as shown in FIG. 5.

Figure 6:
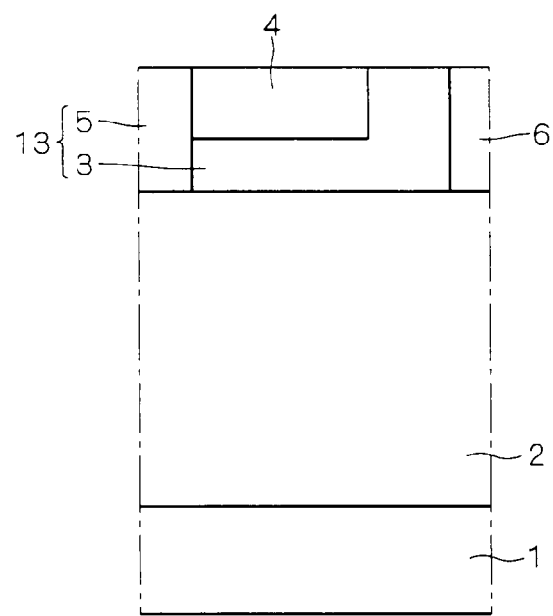
FIG. 6 is a view showing a step in the process of manufacturing the power semiconductor device according to the first preferred embodiment.

Next, when the doping concentration of the n-type SiC depletion region 6 is to be made different from that of the n-type SiC drift layer 2, for example, selective ion implantation is performed to form the n-type SiC depletion region 6, as shown in FIG. 6.

Figure 7:
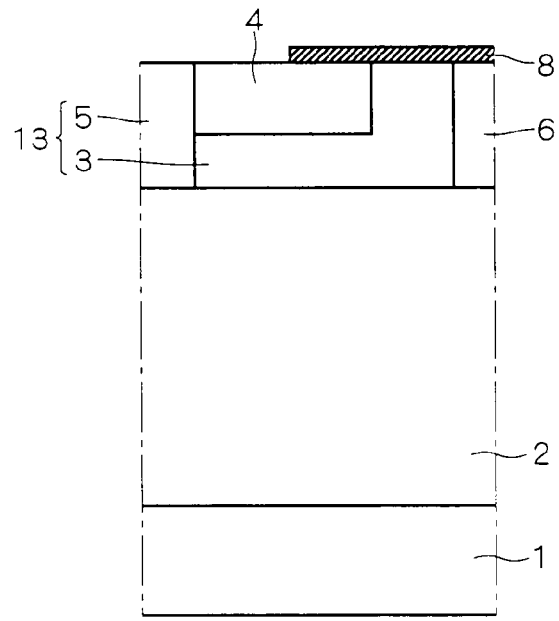
FIG. 7 is a view showing a step in the process of manufacturing the power semiconductor device according to the first preferred embodiment.

Next, as shown in FIG. 7, the gate insulation film 8 (e.g., a silicon oxide film or a silicon oxy-nitride film) is formed on a portion of the n-type SiC source region 4 and on the surfaces of the p-type SiC base region 3 and the n-type SiC depletion region 6 by a thermal oxidation process or a CVD (Chemical Vapor Deposition) process.

Figure 8:
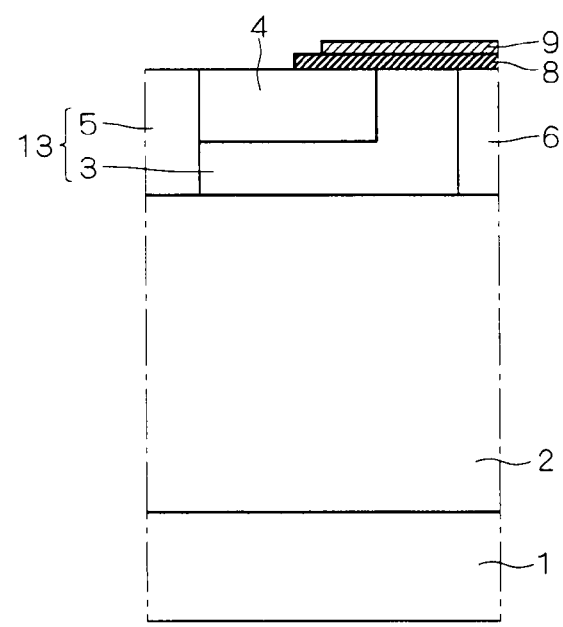
FIG. 8 is a view showing a step in the process of manufacturing the power semiconductor device according to the first preferred embodiment.
Figure 9:
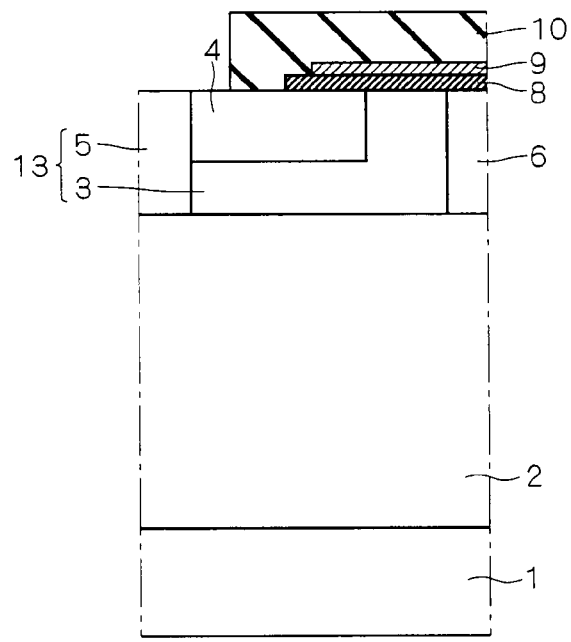
FIG. 9 is a view showing a step in the process of manufacturing the power semiconductor device according to the first preferred embodiment.
Figure 10:
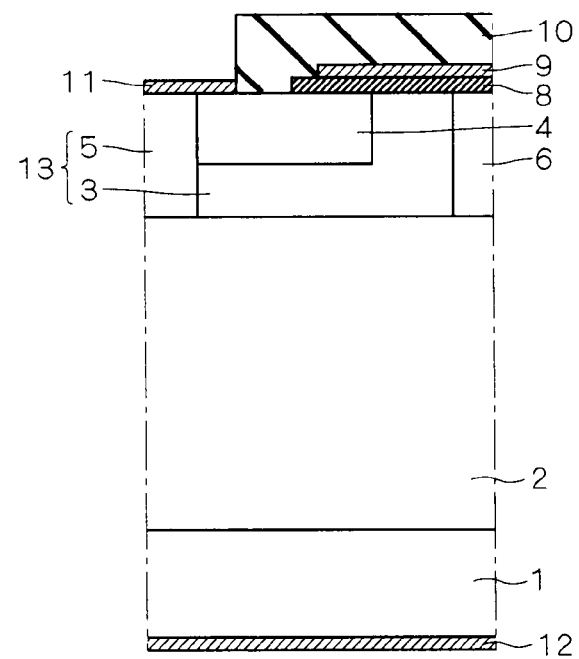
FIG. 10 is a view showing a step in the process of manufacturing the power semiconductor device according to the first preferred embodiment.

Next, as shown in FIG. 8, the gate electrode 9 (e.g., a polysilicon film) is formed on the gate insulation film 8 by a CVD process and the like. Subsequently, as shown in FIG. 9, the interlayer insulation film 10, such as a silicon oxide film and the like, is formed. A portion of the interlayer insulation film 10 in which the source electrode 11 is to be formed is removed, as mentioned above. Thereafter, as shown in FIG. 10, metal layers made of Ni or containing Ni are formed as the source electrode 11 and the drain electrode 12 by a metal deposition process and the like.

Figure 11:
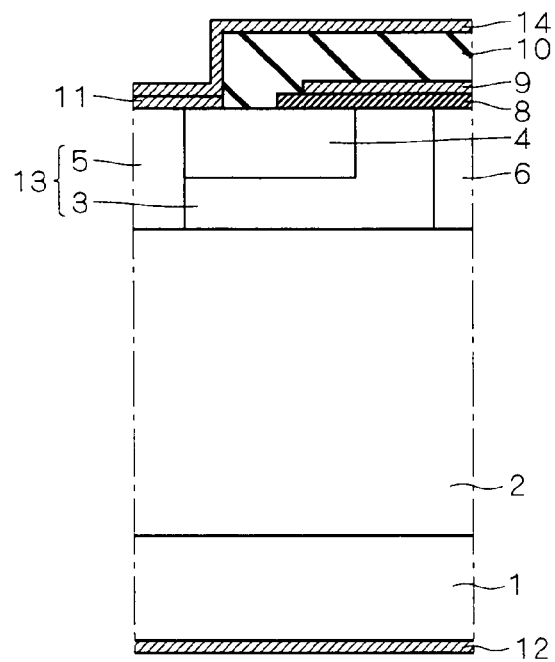
FIG. 11 is a view showing a step in the process of manufacturing the power semiconductor device according to the first preferred embodiment.
Figure 12:
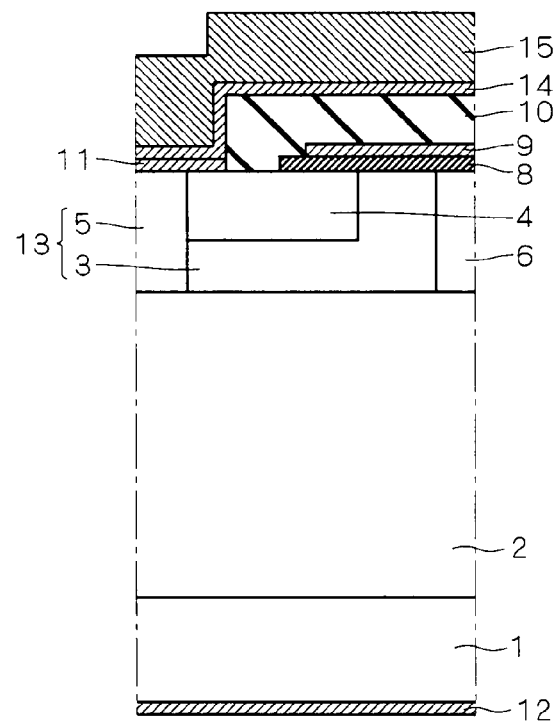
FIG. 12 is a view showing a step in the process of manufacturing the power semiconductor device according to the first preferred embodiment.
Figure 13:
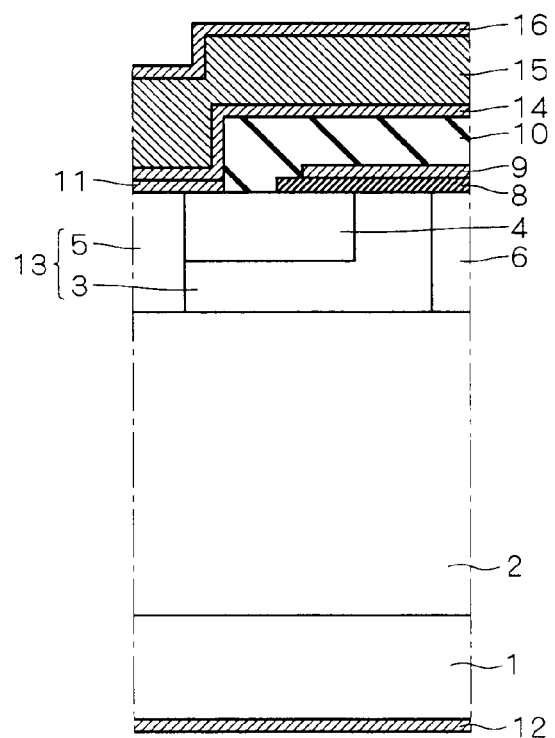
FIG. 13 is a view showing a step in the process of manufacturing the power semiconductor device according to the first preferred embodiment.

Next, as shown in FIG. 11, the first metal layer 14 is formed on the source electrode 11 and the interlayer insulation film 10 by a metal vapor deposition process and the like. Next, as shown in FIG. 12, the second metal layer 15 is formed on the first metal layer 14 by a metal vapor deposition process and the like. Then, as shown in FIG. 13, the third metal layer 16 is formed on the second metal layer 15 by a metal vapor deposition process and the like.

The activation heat treatments of implanted ion species in the respective layers may be performed collectively prior to the formation of the gate insulation film 8 and the gate electrode 9 or be performed as occasion arises.

The power semiconductor device according to the first preferred embodiment includes the first metal layer 14 containing at least one selected from the group consisting of Pt, Ti, Mo, W and Ta, and the second metal layer 15 containing at least one selected from the group consisting of Mo, W and Cu. The use of any one of Mo, W and Cu which are materials having low reactivity for the second metal layer 15 makes a reaction between the source electrode 11 formed on the n-type SiC source region 4 serving as the semiconductor region and the second metal layer 15 less prone to occur even during high-temperature operation when the second metal layer 15 is used as the interconnect metal. The provision of the first metal layer 14 containing at least one selected from the group consisting of Pt, Ti, Mo, W and Ta which are materials having lower reactivity between the source electrode 11 and the second metal layer 15 prevents the phenomenon of the incorporation of other metal species into the source electrode 11 even during high-temperature operation. When a metal layer containing Cu is used as the second metal layer 15, the provision of the first metal layer 14 between the n-type SiC source region 4 serving as the semiconductor region and the second metal layer 15 reduces a strain resulting from the difference in thermal expansion coefficient between the n-type SiC source region 4 and the second metal layer 15. This achieves the power semiconductor device less prone to cause a reaction between the metal material for interconnection and the electrode connected to the semiconductor region and the like during the high-temperature operation thereof and less prone to be strained during the high-temperature operation thereof.

Additionally, the power semiconductor device according to the first preferred embodiment further includes the third metal layer 16 formed on the second metal layer 15 and containing at least one selected from the group consisting of Pt, Mo and W. The formation of the third metal layer 16 containing at least one selected from the group consisting of Pt, Mo and W which are materials having low reactivity on the surface of the second metal layer 15 prevents the degradation of the surface of the second metal layer 15 resulting from oxidation and the like during high-temperature operation.

In this manner, the provision of the first metal layer 14, the second metal layer 15 and the third metal layer 16 on the source electrode 11 and on the interlayer insulation film 10 prevents the reactions of the second metal layer 15 functioning as the interconnect line with the source electrode 11, the source region 4, the p-type SiC region 13 and the interlayer insulation film 10 during high-temperature operation and the occurrence of stresses, and also prevents the oxidation of the surfaces of the metal layers.

Further, the power semiconductor device according to the first preferred embodiment further includes the interlayer insulation film 10 formed in a region which is on the surface of the n-type SiC drift layer 2 serving as the semiconductor layer and which is other than the region where the source electrode 11 is formed. The first and second metal layers 14 and 15 extend over the interlayer insulation film 10. This makes the reactions of the second metal layer 15 with the gate insulation film 8 formed on the surface of the n-type SiC drift layer 2 and the various films (e.g., the gate electrode 9) under the interlayer insulation film 10 less prone to occur even during high-temperature operation when the second metal layer 15 is used as the interconnect metal.

The first to third metal layers 14 to 16 are described above as formed on the source electrode 11. A structure may be employed in which a second group of first to third metal layers are formed on the gate electrode 9 independently of or in addition to the above-mentioned first to third metal layers 14 to 16. In such a case, the structure is as follows: the gate insulation film 8 serving as a first insulation film is formed on the p-type SiC base region 3 serving as the semiconductor region; the gate electrode 9 is formed on the gate insulation film 8; and the second group of first to third metal layers are formed on the gate electrode 9. Then, the interlayer insulation film 10 functions as a second insulation film formed in a region which is on the surface of the n-type SiC drift layer 2 and on the surface of the gate insulation film 8 and which is other than the region where the gate electrode 9 is formed.

Figure 14:
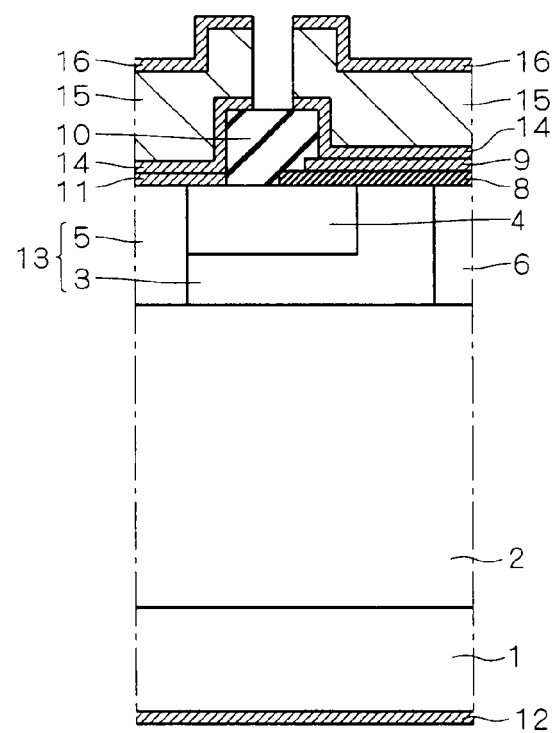
FIG. 14 is a view showing a modification of the power semiconductor device according to the first preferred embodiment.

The manufacturing method in this case may include the step of removing a portion of the interlayer insulation film 10 where the interconnect lines (the second group of first to third metal layers) are to be formed on the gate electrode 9 either during the partial removal of the interlayer insulation film 10 for the formation of the source electrode 11 or separately. Thus, the MOSFET is manufactured by forming the first to third metal layers 14 to 16 on the source electrode 11 and/or the gate electrode 9. In this course, when the removal of the portion of the interlayer insulation film 10 where the interconnect lines (the second group of first to third metal layers) are to be formed on the gate electrode 9 is carried out simultaneously with the partial removal of the interlayer insulation film 10 for the formation of the source electrode 11, the material of the source electrode 11 and the first to third metal layers 14 to 16 are formed on the gate electrode 9. On the other hand, when the removal of the portion of the interlayer insulation film 10 where the interconnect lines (the second group of first to third metal layers) are to be formed on the gate electrode 9 is carried out after the formation of the source electrode 11 separately from the partial removal of the interlayer insulation film 10 for the formation of the source electrode 11, only the first to third metal layers 14 to 16 are formed in an interconnect line portion on the gate electrode 9. FIG. 14 shows a structure of the present power semiconductor device in the case where the latter method is used to form the first to third metal layers 14 to 16 on the gate electrode 9.

In the above-mentioned instance, a portion of the p-type SiC base region 3 lying near a contact surface with the gate insulation film 8 serves as a channel region. However, additional ion implantation into a portion near this channel region may be performed to additionally form a channel layer.

Figure 15:
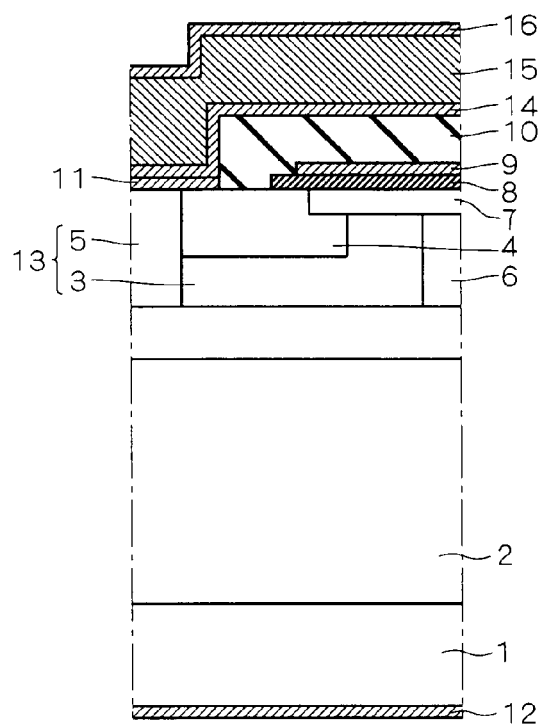
FIG. 15 is a view showing a modification of the power semiconductor device according to the first preferred embodiment.
Figure 16:
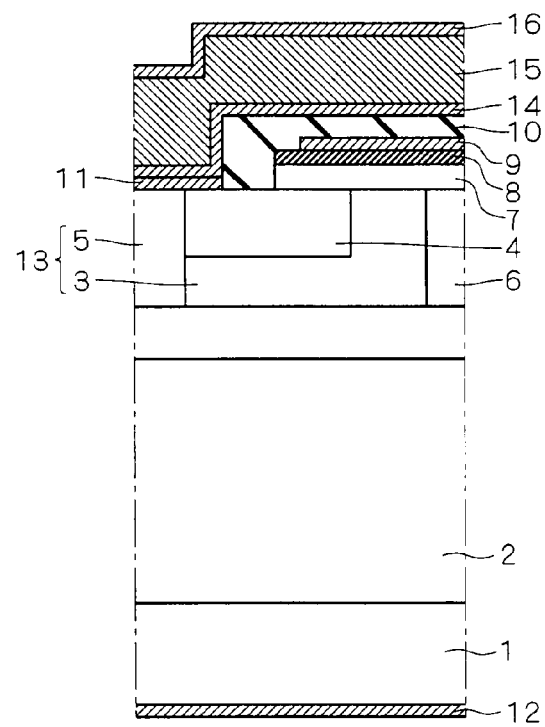
FIG. 16 is a view showing a modification of the power semiconductor device according to the first preferred embodiment.

FIGS. 15 and 16 are views showing modifications of the power semiconductor device according to the first preferred embodiment. With reference to FIG. 15, a channel layer 7 is formed in the surface of the p-type SiC base region 3, in the surface of a portion of the n-type SiC source region 4 and in the surface of the n-type SiC depletion region 6 continuously. This channel layer 7 may be formed by selectively implanting ions into the surface of the n-type SiC drift layer 2 serving as the semiconductor layer prior to the formation of the gate insulation film 8. Except for this, the device construction and the manufacturing method thereof are identical with those of FIG. 1.

With reference to FIG. 16, the channel layer 7 is formed on the surface of the p-type SiC base region 3, on the surface of a portion of the n-type SiC source region 4 and on the surface of the n-type SiC depletion region 6 continuously. This channel layer 7 may be formed by forming a semiconductor film such as a silicon film and the like by epitaxial growth prior to the formation of the gate insulation film 8 and then performing a photolithographic technique so that the semiconductor film is in the same pattern as the gate insulation film 8. Except for this, the device construction and the manufacturing method thereof are identical with those of FIG. 1.

The channel layer 7 may be dispensed with. The instance of FIG. 1 corresponds to an instance in which the channel layer 7 is dispensed with. When the channel layer 7 is provided as mentioned above, the conductivity type of the channel layer 7 may be either n type or p type. To ameliorate surface roughness resulting from the activation heat treatment of implanted ion species, it is desirable to form the channel layer 7 by epitaxial growth, which results in the structure shown in FIG. 16. If the surface roughness resulting from the activation heat treatment is slight, a structure in which the channel layer is formed by selective ion implantation as shown in FIG. 15 may be employed.

The n-type low-resistance SiC substrate 1, the n-type SiC drift layer 2, the p-type SiC region 13, the n-type SiC source region 4 and the like are made of SiC in this preferred embodiment. However, the elements constituting these parts are not necessarily limited to SiC. For example, other semiconductors such as Si and the like may be employed as the elements constituting these parts.

The MOSFET is employed as an example of the power semiconductor device, and the interconnect metal to the source electrode 11 of the MOSFET is described above. The power semiconductor device, however, is not limited to the MOSFET. The present invention may be similarly applied to interconnect metal to every electrode connected to a semiconductor region in a switching device and a diode device.

The Ni-based electrode is described above as employed as the electrode material of the source electrode 11. The present invention, however, may be applied to the use of materials other than the Ni-based material such as Al, Ti, a polycrystalline silicon film and the like as the electrode material.

Figure 17:
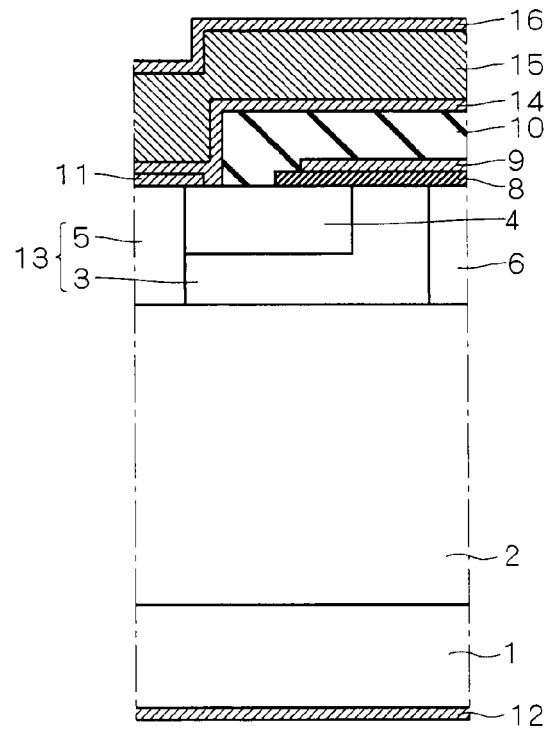
FIG. 17 is a view showing a modification of the power semiconductor device according to the first preferred embodiment.

The source electrode 11 is shown above as configured to be in contact with the interlayer insulation film 10. However, if there is apprehension about the reaction between the source electrode 11 and the interlayer insulation film 10 during high-temperature operation depending on the species of the material of the source electrode 11, the present invention may be applied to a structure in which the first metal layer 14 is present between the source electrode 11 and the interlayer insulation film 10 and the interlayer insulation film 10 and the source electrode 11 are covered with the first metal layer 14 so that the source electrode 11 is not in contact with the interlayer insulation film 10, as shown in FIG. 17.

Second Preferred Embodiment

A second preferred embodiment is a modification of the power semiconductor device according to the first preferred embodiment. The power semiconductor device according to the second preferred embodiment is structured such that the above-mentioned third metal film 16 shown with respect to the First Preferred Embodiment in FIGS. 1, 15 and 16 is not present.

Figure 18:
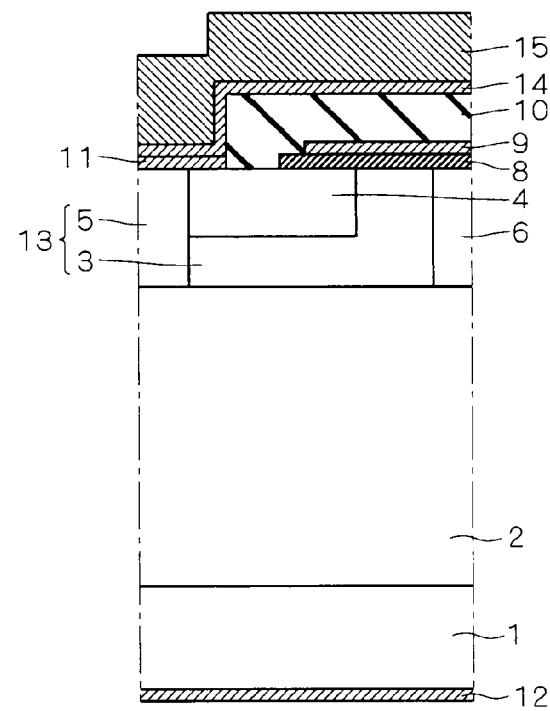
FIG. 18 is a view showing part of the power semiconductor device according to a second preferred embodiment.
Figure 19:
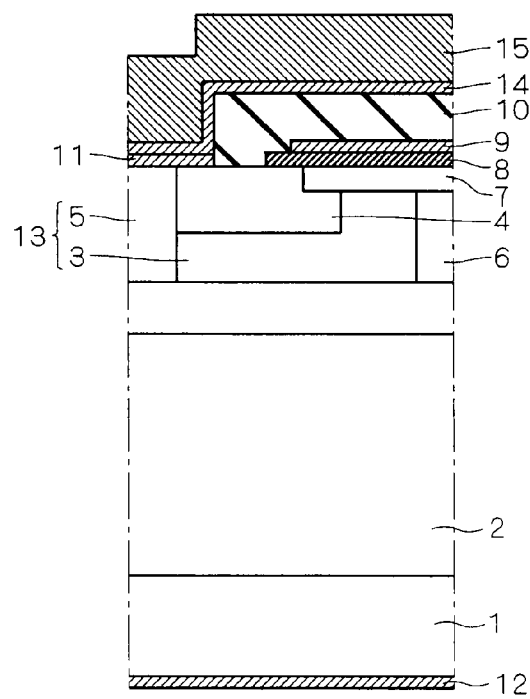
FIG. 19 is a view showing part of the power semiconductor device according to the second preferred embodiment.
Figure 20:
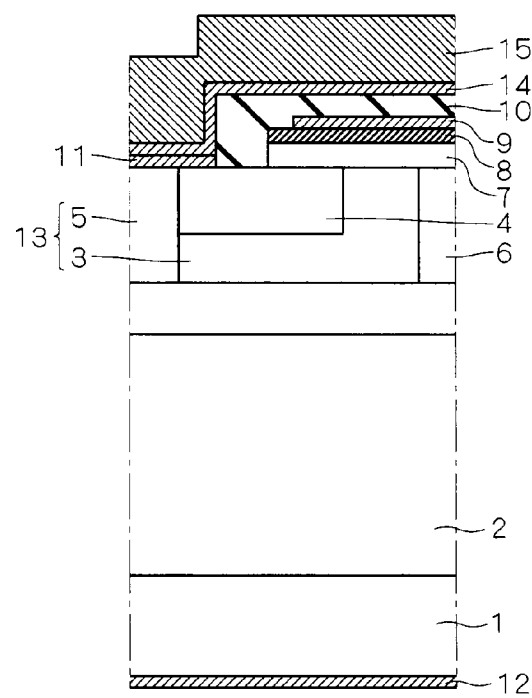
FIG. 20 is a view showing part of the power semiconductor device according to the second preferred embodiment.

FIGS. 18, 19 and 20 are views showing the power semiconductor device according to the second preferred embodiment which is structured such that the third metal layer 16 is not present on the structure of the power semiconductor device of FIGS. 1, 15 and 16, respectively.

In the first preferred embodiment, the instance in which the film containing Cu is employed as the second metal layer 15 is discussed, and the third metal layer 16 is provided to prevent the surface of the second metal layer 15 from degrading because of oxidation and the like during high-temperature operation. However, when the second metal layer 15 contains at least one selected from the group consisting of Mo and W and does not contain Cu, the structure in which the third metal layer 16 is dispensed with may be used, as shown in FIGS. 18 to 20.

The use of a Cu-free material for the second metal layer 15 allows the second metal layer 15 to be made of a material relatively close in thermal expansion coefficient to a semiconductor material, thereby preventing the occurrence of a strain during high-temperature operation. The use of such a material for the interconnect metal layer enables the device to operate with stability without degradation starting from the metal portions of the electrode and of the interconnect portion even at a high temperature not less than 200° C.

The invention claimed is:

1. A power semiconductor device comprising:
   a semiconductor layer having a surface, said semiconductor layer being formed of SiC;
   a semiconductor region of a predetermined conductivity type, said semiconductor region being formed in said semiconductor layer so as to be exposed at least at a portion of said surface of said semiconductor layer;
   a first insulation film formed on said semiconductor region;
   an electrode formed on said semiconductor region or on said first insulation film;
   a first metal layer formed on said electrode and containing at least one selected from the group consisting of Pt, Ti, Mo, W and Ta; and
   a second metal layer formed as a single-layer film on said first metal layer and containing at least one selected from the group consisting of Mo, W, and not containing Cu,
   wherein the second metal layer is an uppermost layer of said power semiconductor device serving as an interconnect layer.

2. The power semiconductor device according to claim 1, further comprising:
   a second insulation film formed in a region which is on said surface of said semiconductor layer and/or on a surface of said first insulation film and which is other than a region where said electrode is formed,
   wherein said first and second metal layers extend over said second insulation film.

3. The power semiconductor device according to claim 1, wherein
   the first metal layer has a thickness between 5 nm and 100 nm; and the second metal layer has a thickness between 100 nm and 700 nm.

4. A power semiconductor device comprising:
   a semiconductor layer having a surface;
   a semiconductor region of a predetermined conductivity type, said semiconductor region being formed in said semiconductor layer so as to be exposed at least at a portion of said surface of said semiconductor layer;
   a first insulation film formed on said semiconductor region;
   an electrode formed on said semiconductor region or on said first insulation film;
   a first metal layer formed on said electrode and containing at least one selected from the group consisting of Pt, Ti, Mo, W and Ta;
   a second metal layer formed on said first metal layer and containing Cu; and
   a third metal layer formed as a single-layer film including Mo on said second metal layer.

5. The power semiconductor device according to claim 4, wherein
   the first metal layer has a thickness between 5 nm and 100 nm; and the second metal layer has a thickness between 100 nm and 700 nm.

6. A power semiconductor device comprising:
   a semiconductor layer having a surface;
   a semiconductor region of a predetermined conductivity type, said semiconductor region being formed in said semiconductor layer so as to be exposed at least at a portion of said surface of said semiconductor layer;
   a first insulation film formed on said semiconductor region;
   an electrode formed on said semiconductor region;
   a first metal layer formed on said electrode and containing at least one selected from the group consisting of Pt, Ti, Mo, W and Ta;
   a second metal layer formed on said first metal layer and containing at least one selected from the group consisting of Mo, W, and does not contain Cu; and
   a second insulation film formed in a region which is on said surface of said semiconductor layer and/or on a surface of said first insulation film and which is other than a region where said electrode is formed, wherein
   said first and second metal layers extend over said second insulation film,
   said first metal layer is present between said electrode formed on said semiconductor region and said second insulation film so as to prevent said electrode and said second insulation film from contacting each other,
   wherein the second metal layer is an uppermost layer of said power semiconductor device serving as an interconnect layer.

7. A power semiconductor device comprising:
   a semiconductor layer having a surface;
   a semiconductor region of a predetermined conductivity type, said semiconductor region being formed in said semiconductor layer so as to be exposed at least at a portion of said surface of said semiconductor layer;
   a first insulation film formed on said semiconductor region;
   an electrode formed on said semiconductor region;
   a first metal layer formed on said electrode and containing at least one selected from the group consisting of Pt, Ti, Mo, W and Ta;
   a second metal layer formed on said first metal layer and containing Cu;
   a third metal layer formed on said second metal layer and containing at least one selected from the group consisting of Pt, Mo, and W; and
   a second insulation film formed in a region which is on said surface of said semiconductor layer and/or on a surface of said first insulation film and which is other than a region where said electrode is formed, wherein
   said first and second metal layers extend over said second insulation film,
   said first metal layer is present between said electrode formed on said semiconductor region and said second insulation film so as to prevent said electrode and said second insulation film from contacting each other.

* * * * *